United States Patent
Lee

(10) Patent No.: US 9,916,052 B2
(45) Date of Patent: *Mar. 13, 2018

(54) CAPACITIVE CONTROLLER AND SENSOR

(71) Applicant: EGALAX_EMPIA TECHNOLOGY INC., Taipei (TW)

(72) Inventor: Cheng-Han Lee, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/955,474

(22) Filed: Dec. 1, 2015

(65) Prior Publication Data
US 2016/0085340 A1 Mar. 24, 2016

Related U.S. Application Data

(63) Continuation of application No. 13/344,745, filed on Jan. 6, 2012, now Pat. No. 9,229,551.

(51) Int. Cl.
| | |
|---|---|
| *G06F 3/044* | (2006.01) |
| *G06F 3/041* | (2006.01) |
| *G06F 3/047* | (2006.01) |
| *H03K 17/96* | (2006.01) |

(52) U.S. Cl.
CPC .............. *G06F 3/044* (2013.01); *G06F 3/041* (2013.01); *G06F 3/047* (2013.01); *G06F 3/0416* (2013.01); *G06F 3/0418* (2013.01); *H03K 17/962* (2013.01); *H03K 17/9622* (2013.01); *G06F 2203/04104* (2013.01); *G06F 2203/04106* (2013.01); *G06F 2203/04112* (2013.01); *H03K 2017/9602* (2013.01)

(58) Field of Classification Search
None
See application file for complete search history.

(56) References Cited

U.S. PATENT DOCUMENTS

| | | | |
|---|---|---|---|
| 4,380,040 A * | 4/1983 | Posset | H03K 17/962 200/600 |
| 5,657,012 A | 8/1997 | Tait | |
| 6,320,282 B1 | 11/2001 | Caldwell | |
| 8,400,423 B2 | 3/2013 | Chang et al. | |
| 2006/0049834 A1 | 3/2006 | Umeda | |
| 2008/0024455 A1 | 1/2008 | Lee et al. | |
| 2010/0092270 A1 | 4/2010 | Adams | |
| 2010/0171723 A1 | 7/2010 | Kobayashi et al. | |

(Continued)

FOREIGN PATENT DOCUMENTS

| | | |
|---|---|---|
| DE | 102007048402 | 4/2009 |
| TW | 200926594 | 6/2009 |
| WO | WO0042628 | 7/2000 |

*Primary Examiner* — Jennifer Mehmood
*Assistant Examiner* — Krishna Neupane
(74) *Attorney, Agent, or Firm* — WPAT, PC

(57) ABSTRACT

The present invention provides a capacitive controller for detecting at least one detecting plate and at least one reference plate surrounding each detecting plate. All of the reference plates are electrically coupled to the same first wire, and each reference plate is electrically coupled to a second wire. When an electrical signal is provided to the first wire and each second wire, one or more detecting plates touched or approached can be detected simultaneously based on the signal difference between each second wire and the first wire.

20 Claims, 5 Drawing Sheets

(56) References Cited

U.S. PATENT DOCUMENTS

| | | |
|---|---|---|
| 2010/0181180 A1 | 7/2010 | Peter |
| 2010/0188345 A1 | 7/2010 | Keskin et al. |
| 2010/0220075 A1* | 9/2010 | Kuo ................... G06F 3/044 345/174 |
| 2010/0301879 A1* | 12/2010 | Philipp ............ G06F 3/03547 324/679 |
| 2010/0320009 A1 | 12/2010 | Kuo et al. |
| 2011/0210936 A1 | 9/2011 | Wang et al. |
| 2011/0227868 A1* | 9/2011 | Chen ................... G06F 3/044 345/174 |

* cited by examiner

CAPACITIVE CONTROLLER AND SENSOR

CROSS REFERENCE TO RELATED APPLICATIONS

This application is a continuation of U.S. patent application Ser. No. 13/344,745, filed Jan. 6, 2012.

BACKGROUND OF THE INVENTION

1. Field of the Invention

The present invention relates to a capacitive controller and sensor, and more particularly, to a capacitive controller and sensor capable of detecting multiple simultaneous touches.

2. Description of the Prior Art

In portable electronic devices, many physical man-machine interfaces are required to allow users to input data or instructions. The most common interface is mechanical keys. However, mechanical keys are easily damaged due to overuse, especially those that are commonly used. In addition, keys may be pressed when storing the portable electronic devices, causing elastic fatigue or poor contact of the keys.

For smart phones or tablet PCs, capacitive sensors are often used as keys. Compared to physical keys, capacitive sensors are not prone to damage from overuse. However, since the screen generates a lot of noises that constantly change, it is easy for capacitive sensors to make mistakes due to noise interferences.

From the above it is clear that prior art still has shortcomings. In order to solve these problems, efforts have long been made in vain, while ordinary products and methods offering no appropriate structures and methods. Thus, there is a need in the industry for a novel technique that solves these problems.

SUMMARY OF THE INVENTION

The capacitive sensor of the present invention includes at least one detecting plate and at least one reference plate surrounding each detecting plate. All of the reference plates are electrically coupled to the same first wire, and each reference plate is electrically coupled to a second wire. When an electrical signal is provided to the first wire and each second wire, one or more detecting plates touched or approached can be detected simultaneously based on the signal difference between each second wire and the first wire.

The capacitive sensor of the present invention can be covered by an insulating protective layer, so detection can be carried out without direction touching, avoiding problems such as elastic fatigue or poor contact with mechanical keys after repetitive uses. In addition, the capacitive sensor of the present invention performs detection by comparing signals of the first wire and each second wire, so it has good noise resistance that is suitable for disposing in front of a display, and it is also capable of simultaneously detecting multiple touches.

An objective of the present invention is to overcome the shortcomings of the prior art by providing a novel capacitive sensor and detection method using the same, wherein the signal of a reference plate is compared with the signal of each detecting plate in order to determine the detecting plate being touched or approached by an external object. It is of practical use.

The objectives of the present invention can be achieved by the following technical schemes. The present invention provides a capacitive controller, executing: providing an electrical signal to a first wire and each of at least one second wire, wherein all of at least one reference plate are electrically coupled to the first wire, and each of at least one detecting plate is electrically coupled to one of the at least one second wire; and comparing a first signal difference with a second signal difference between one of the at least one second wire and the first wire so as to determine if the detecting plate electrically coupled to the second wire corresponding to the second signal difference is touched or approached by an external object, wherein the first signal difference is a difference between the first wire and one of the at least one second wire not touched or approached by any external object.

The objectives of the present invention also can be achieved by the following technical schemes. The present invention provides a capacitive sensor, comprising: a first wire; at least one reference plate for defining at least one space, and all of the reference plates being electrically coupled to the first wire; at least one detecting plate, each of which residing in one of the at least one space and being electrically coupled to one of the at least one second wire; and a controller for providing an electrical signal to the first wire and each second wire, and comparing a first signal difference with a second signal difference between one of the at least one second wire and the first wire so as to determine if the detecting plate electrically coupled to the second wire corresponding to the second signal difference is touched or approached by an external object, wherein the first signal difference is a difference between the first wire and one of the at least one second wire not touched or approached by any external object.

Compared to the prior art, the present invention has significant advantages and beneficial effects. With the above technical schemes, the capacitive sensor and the detection method using the same exhibit at least the following advantages and beneficial effects:

1. Capable of detecting one touch or approach by an external object or simultaneously detecting multiple touches or approaches by an external object;

2. Capable of detecting the change of state of one signal or simultaneously detecting the changes of states of multiple signals; and 3. Having high noise resistance suitable for disposing in front of displays that emit noises in different levels.

The above description is only an outline of the technical schemes of the present invention. Preferred embodiments of the present invention are provided below in conjunction with the attached drawings to enable one with ordinary skill in the art to better understand said and other objectives, features and advantages of the present invention and to make the present invention accordingly.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
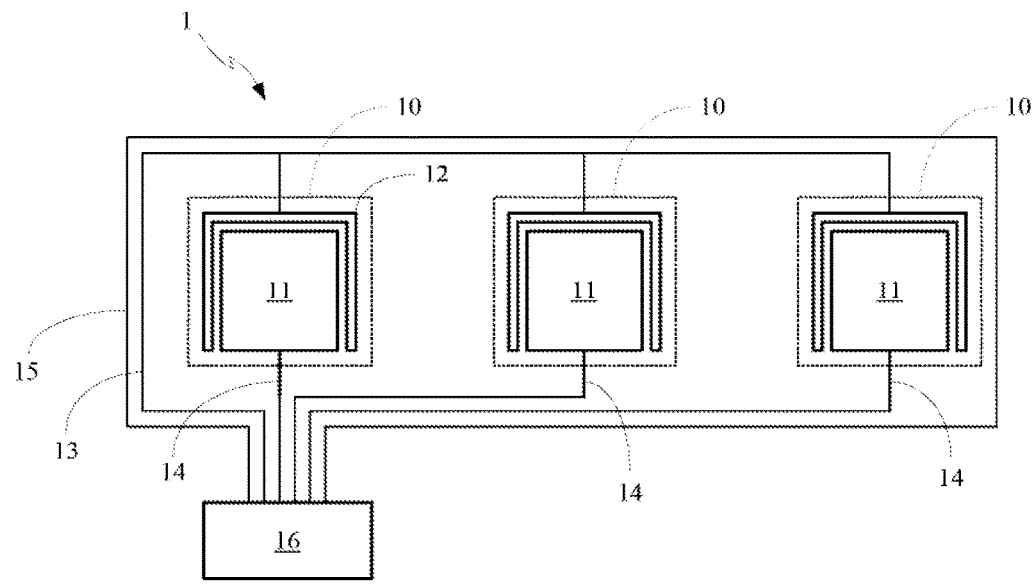
FIGS. 1 to 4 are schematic diagrams depicting a capacitive sensor according to a first embodiment of the present invention.

Some embodiments of the present invention are described in details below. However, in addition to the descriptions given below, the present invention can be applicable to other embodiments, and the scope of the present invention is not limited by such, rather by the scope of the claims. Moreover, for better understanding and clarity of the description, some components in the drawings may not necessary be drawn to scale, in which some may be exaggerated relative to others, and irrelevant parts are omitted.

According to a first embodiment of the present invention, a capacitive sensor is provided, which includes a first wire, at least one second wire, at least one reference plate, at least one detecting plate, a controller, and a shielding line. The at least one detecting plate defines (or separates out) at least one space, and all reference plates are electrically coupled to the first wire. In addition, each detecting plate is electrically coupled to a second wire. Moreover, the controller provides electrical signals to the first wire and each second wire, and detects touching or approaching by an external object based on the signal difference between each second wire and the first wire, respectively.

For example, as shown in FIG. 1, a capacitive sensor 1 includes a first wire 13, at least one second wire 14, at least one detector 10 and a controller 16, wherein each detector 10 includes a detecting plate 11 and a reference plate 12. The reference plate 12 is in the shape of "U", which defines a space in which the detecting plate 11 resides, and the detecting plate 11 is electrically coupled to a second wire 14. Although three detectors 10 are shown in FIG. 1, one with ordinary skill in the art can appreciate that the number of detectors may include, but is not limited to, three.

In an example of the present invention, the capacitive sensor includes at least one detector. Each detector includes a detecting plate and at least one reference plate. The at least one reference plate defines a space in which the detecting plate resides.

Figure 2:
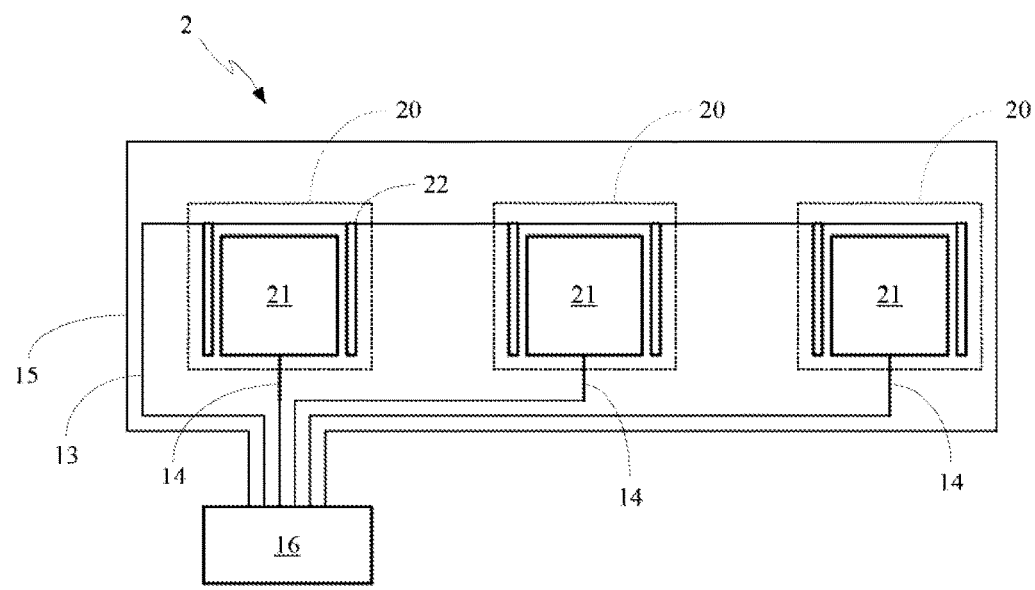

As another example, referring to FIG. 2, a capacitive sensor 2 includes a first wire 13, at least one second wire 14, at least one detector 20 and a controller 16, wherein each detector 20 includes a detecting plate 21 and two reference plates 22. The two reference plates 22 defines a space in which the detecting plate 21 resides, and the detecting plate 21 is electrically coupled to a second wire 14. The space may also be regarded as defined by the two reference plates 22 and the first wire 13. Although three detectors 20 are shown in FIG. 2, one with ordinary skill in the art can appreciate that the number of detectors 20 may include, but is not limited to, three.

In another example of the present invention, the capacitive sensor includes at least one reference plate for defining a plurality of spaces, and all reference plates are coupled to the first wire. Each detecting plate resides in a space, respectively, and is electrically coupled to a second wire, respectively.

Figure 3:
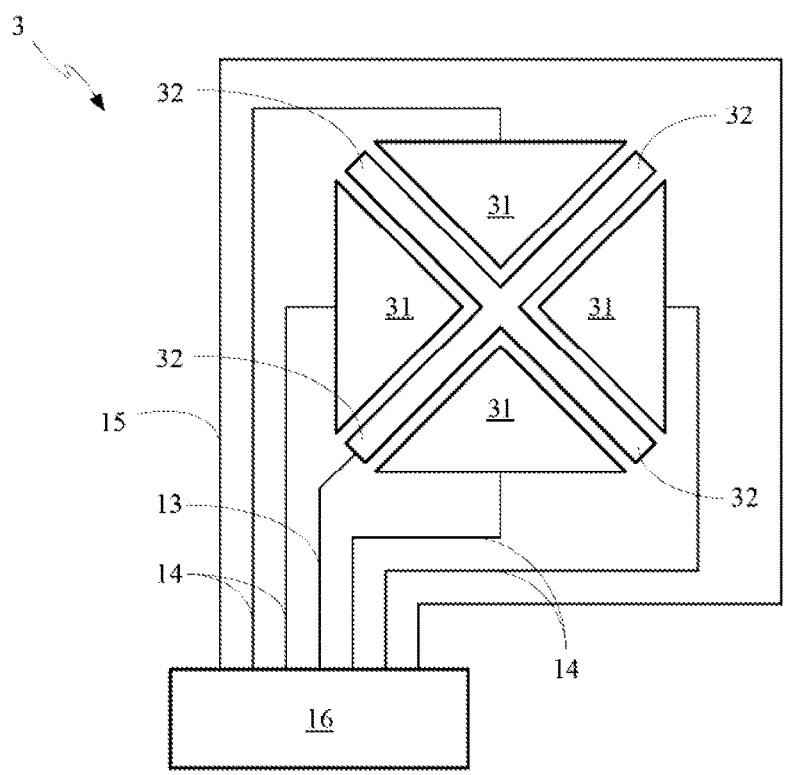

As shown in FIG. 3, a capacitive sensor 3 includes a reference plate 32 (e.g. formed by four pieces of reference plates connected together or formed integrally by a single reference plate) or four reference plates 32 for defining four spaces, and a detecting plate 31 is disposed in each of the spaces.

Figure 4:
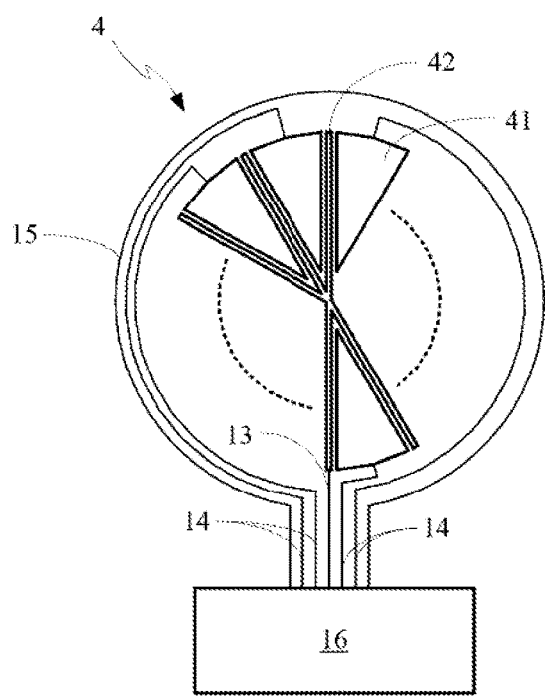

Alternatively, as shown in FIG. 4, a capacitive sensor 4 includes a reference plate 42 (e.g. formed by a plurality of reference plates connected together or formed integrally by a single reference plate) or a plurality of reference plates 42 for defining a plurality of spaces, and a detecting plate 41 is disposed in each of the spaces.

Moreover, in FIGS. 1 to 4, the shielding line 15 generally surrounds the first wire 13, the at least one second wire 14, the at least one reference plate (12, 22, 32, and 42), and the at least one detecting plate (11, 21, 31, and 41), and is electrically coupled to the controller 16. In an example of the present invention, the first wire 13 and all second wires 14 can be arranged in parallel with respect to the controller 16. The shielding line 15 may consist of one or multiple lines disposed at either side of the first wire 13 and all second wires 14. In another example of the present invention, there are two shielding lines 15, each disposed at one of two sides of the first wire 13 and all second wires 14 arranged in parallel.

In an example of the present invention, the first wire 13 and the at least one second wire 14 are connected to the controller in a parallel fashion. For example, a portion of the first wire 13 and the at least one second wire 14 are arranged in parallel on a flat printed circuit board or flexible cable. In addition, the shielding line 15 may include one or two lines disposed at either side of the first wire 13 and the at least one second wire 14. In an example of the present invention, the shielding line 15, the first wire 13, and the at least one second wire 14 are simultaneously provided with the same electrical signal. Accordingly, when there is no touching or approaching by an external object, both sides of the first wire 13 and each of the at least one second wire 14 will have symmetrical electrical fields. Therefore, when there is no touching or approaching by an external object, both sides of the portion of the first wire 13 and each of the at least one second wire 14 arranged in parallel with the controller 16 will have symmetrical electrical fields.

One with ordinary skill in the art can appreciate that the shape of the detecting plate in this present invention includes, but is not limited to, square, rectangle, fan, triangle, circle, oval, polygon, or other geometric pattern.

In an example of the present invention, the electrical signal provided by the controller to the first wire and the second wire can be a pulse width modulated (PWM) signal or other types of AC signal; the present invention is not limited to these. The electrical signal can be continuously provided. In an example of the present invention, the electrical signal can be continuously provided at intervals; in another example of the present invention, the electrical signal can be continuously provided persistently.

In addition, the controller may detect the capacitive coupling of a conductor connected with the first wire and the second wire by an integrator to detect the magnitude of the signal or signal variation. Moreover, the signal difference between each of the second wire and the first wire can be generated by one or more differential amplifiers. One with ordinary skill in the art can appreciate that the signal difference can also be generated by other forms of subtractors; the present invention is not limited to these.

Figure 5:
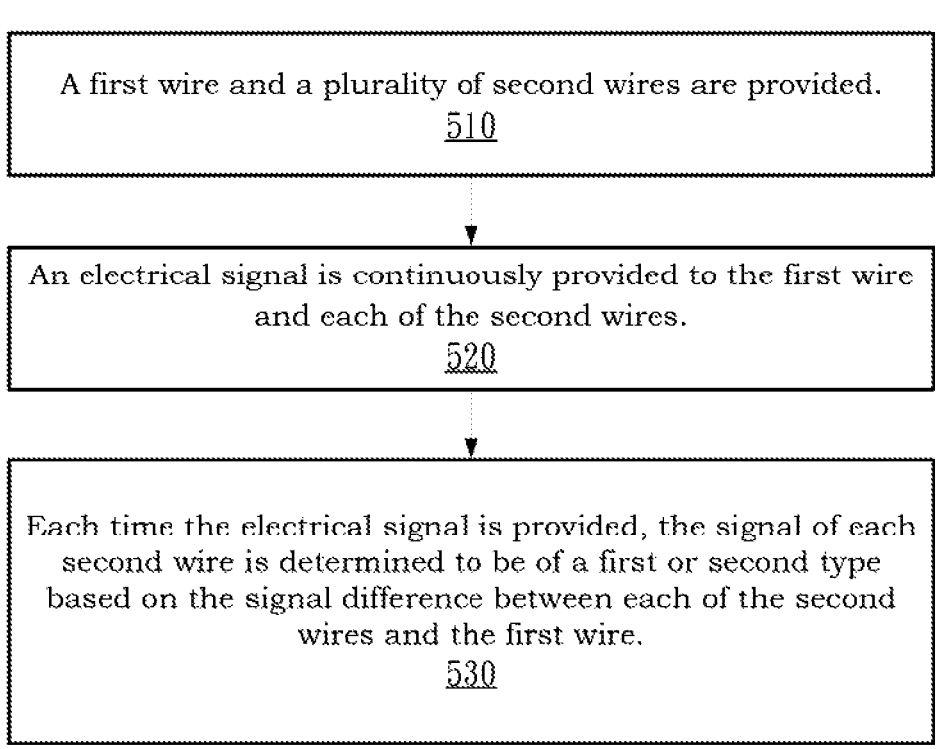
FIG. 5 is a flowchart illustrating a detection method of a capacitive sensor according to a second embodiment of the present invention.

FIG. 5 is a detection method of a capacitive sensor according to a second embodiment of the present invention. First, as shown in step 510, a first wire 13 and a plurality of second wires 14 are provided. Then, in step 520, an electrical signal is continuously provided to the first wire 13 and each of the second wires 14. In addition, in step 530, each time the electrical signal is provided, the signal of each second wire 14 is determined to be of a first or second type based on the signal difference between each of the second wires 14 and the first wire 13.

In an example of the present invention, steps 520 and 530 can be carried out by the controller 16. The first wire 13 and each of the second wires 14 provided in step 510 are electrically coupled to at least one conductor, respectively. The total dimension of at least one conductor to which the first wire 13 electrically coupled is equal or approximately equal to the total dimension of at least one conductor to which each second wire 14 electrically coupled. For example, in FIGS. 1 to 4, the first wire 13 is electrically coupled to a plurality of reference plates 12, 22, 32, or 42, and each second wire 14 is electrically coupled to a detecting plate 11, 21, 31, or 41. One with ordinary skill in the art can appreciate that the detecting plate 11 may constitute a plurality of sub-detecting plates, that is, each second wire 14 can also be electrically coupled to the plurality of sub-detecting plates. In an example of the present invention, the at least one conductor to which the first wire 13 electrically coupled defines a plurality of spaces, and the at least one conductor to which each second wire 14 electrically coupled resides in one of the spaces, respectively.

Since the total dimension of at least one conductor to which the first wire 13 electrically coupled is equal or approximately equal to the total dimension of at least one conductor to which each second wire 14 electrically coupled, when there is no external object touching or approaching all conductors, the signals of the first wire 13 and each second wire 14 are equal or approximately equal. In an example of the present invention, all the conductors can be covered with an insulating layer. This insulating layer can be transparent or opaque, such as a transparent glass or film. A touch or approach by an external object may mean that the external object touches or approaches the insulating layer.

The external object may be physically or virtually grounded, for example, may be a body part (e.g. a finger) of a human standing on the ground. When the external object touches or approaches a conductor, the signal of the conductor varies with the distance and area of the touch by the external object. Therefore, when an external object simultaneously approaches or touches a detecting plate and a portion of a reference plate, the area on the detecting plate that corresponds to the touch or approach of the external object is relatively bigger than the area on the reference plate that corresponds to the touch or approach of the external object. In other words, the signal variation of a second wire 14 electrically coupled to a detecting plate being touched or approached by the external object will be greater than the signal variation of the first wire 13 (electrically coupled to all reference plates). Conversely, the signal variation of a second wire 14 electrically coupled to a detecting plate not touched or approached by the external object will be less than the signal variation of the first wire 13. As a result, it can be determined that whether a detecting plate is being touched or approached by an external object (e.g. as one of first and second types) or not (as the other of first and second types) based on the signals of the second wire 14 and the first wire 13.

For example, the touch or approach of the external object will cause the signal to reduce. Thus, it can be determined that whether a detecting plate electrically coupled to each second wire 14 is being touched or approached directly based on the signal difference of each second wire 14 and the first wire 13. For example, when the signal difference is greater or less than a threshold, there is a touch or approach by an external object. The signal difference when no external touch or approach exists can also be used as a reference. For example, the signal difference detected during an initial period may be used as the signal difference when no external touch or approach exists, which is subsequently compared with signal differences detecting during a plurality of consecutive detecting periods. When the difference between the signal differences of the initial period and a detecting period is greater or less than a threshold, there is a touch or approach by an external object. In an example of the present invention, when the signal difference exceeds a predetermined range or the difference between the signal differences of the initial period and a detecting period exceeds a predetermined range, there is a touch or approach by an external object, and vice versa. This predetermined range can be less or greater than a threshold.

In an example of the present invention, a sign (positive or negative) of the signal difference or the difference between the signal differences of an initial period and a detecting period can be used to determine whether it is a first type or a second type. For example, if the signal difference between a second wire 14 and the first wire 13 is positive, then the signal of the second wire 14 is one of the first and second types, and if the signal difference between a second wire 14 and the first wire 13 is negative, then the signal of the second wire 14 is the other of the first or second types.

Thus, when some of the detecting plates are touched or approached and some of the detecting plates are not touched or approached, a conductor electrically coupled to at least one second wire 14 will be identified as the first type, and a conductor electrically coupled to at least one second wire 14 will be identified as the second type, wherein the conductor electrically coupled to the first wire 13 is touched or approached by the external object.

By comparing signals of each second wire 14 and the first wire 13 of the capacitive sensor of the present invention, one or more detecting plates touched or approached by an external object can be determined. The comparison of the signals of the two can be performed by a comparator, or a signal difference between the two can be generated by a differential amplifier for comparison, or the signals of the two can be converted into digital difference for comparison, or the signals of the two can be converted into digital value before comparison is made. The present invention is not limited to the signal comparison methods just described, and one with ordinary skill in the art can appreciate other types of signal comparison methods which will not be described any further.

The capacitive sensor of the present invention can be used as keys, as shown in FIGS. 1 and 2, for example, each detecting plate can correspond to an independent key. The capacitive sensor of the present invention is able to detect a plurality of simultaneous key presses. Keys can also be designed as arrow keys, as shown in FIG. 3, which include up, right, down, and left arrow keys. One with ordinary skill in the art can appreciate other types of arrow keys, such as those including 8 directions, or multiple directions, such as that shown in FIG. 4, which is a circular multi-directional sensor that can be used as a jog dial and etc.

In an example of the present invention, a plurality of capacitive sensors can be combined together. For example, there can be multiple sets of capacitive sensors. Each capacitive sensor includes a first wire, at least one second wire, at least one reference plate, at least one detecting plate, a controller, and a shielding line. The at least one detecting plate defines (or separates out) at least one space, and all reference plates are electrically coupled to the first wire. In addition, each detecting plate is electrically coupled to a second wire. Moreover, the controller provides electrical signals to the first wire and each second wire, and detects a touching or approaching of each detector by an external object based on the signal difference between each second wire and the first wire, respectively. As a result, all detecting plates can form a detecting plate matrix.

These capacitive sensors can each have an independent first wire 13 and a plurality of second wires 14, directly connected to the controller 16, or jointly connected to a wire of the controller 16 through the control of a switch. At any one time, there is only one capacitive sensor (i.e. the first wire 13 and the plurality of second wires 14) electrically coupled to the controller 16.

Figure 6:
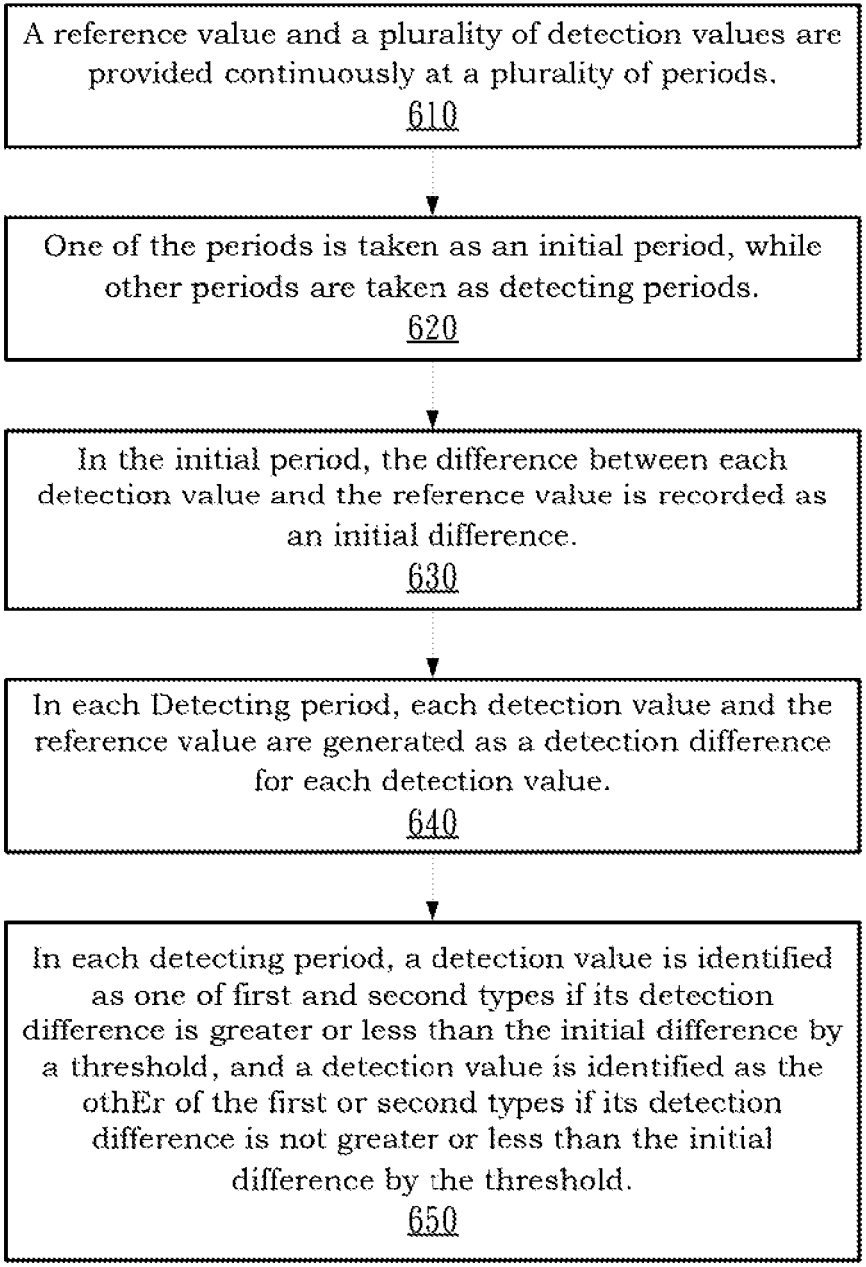
FIG. 6 is a flowchart illustrating a detection method of a capacitive sensor using signal differences according to a third embodiment of the present invention.

FIG. 6 is a detection method of a capacitive sensor using signal differences according to a third embodiment of the present invention. First, in step 610, a reference value and a plurality of detection values are provided continuously at a plurality of periods, and then, in step 620, one of the periods is taken as an initial period, while other periods are taken as detecting periods. For example, the first period is taken as the initial period, or an arbitrary period is taken as the initial period. Steps 610 and 620 can be performed repetitively.

Next, in step 630, in the initial period, the difference between each detection value and the reference value is recorded as an initial difference. Then, in step 640, in each detecting period, each detection value and the reference value are generated as a detection difference for each detection value. In addition, in step 650, in each detecting period, a detection value is identified as one of first and second types if its detection difference is greater or less than the initial difference by a threshold, and a detection value is identified as the other of the first or second types if its detection difference is not greater or less than the initial difference by the threshold. Steps 630, 640, and 650 can be performed repetitively following steps 610 and 620. Moreover, steps 610 to 650 can be performed by the controller 160.

The above method can be applied to a capacitive sensor using signal differences for detection, the sensor can include: a first wire; at least one second wire; at least one reference plate for defining at least one space, and all of the reference plates being electrically coupled to the first wire; at least one detecting plate, each of which residing in one of the at least one space and being electrically coupled to one of the at least one second wire; and a controller for performing at least the following operations: providing an electrical signal to the first wire and each second wire continuously at a plurality of time periods to obtain a reference value and a plurality of detection values, respectively; taking one of the periods as an initial period, while other periods as detecting periods; in the initial period, recording the difference between each detection value and the reference value an initial difference; in each detecting period, generating each detection value and the reference value as a detection difference for each detection value; in each detecting period, identifying a detection value as one of first and second types if its detection difference is greater or less than the initial difference by a threshold, and a detection value is identified as the other of the first or second types if its detection difference is not greater or less than the initial difference by the threshold.

In an example of the present invention, the reference value is generated based on the signal of at least one reference plate. The at least one reference plate defines a plurality of spaces, and each detection value is generated based on the signal of one of a plurality of detecting plates. Each detecting plate resides in one of these spaces.

In another example of the present invention, when the detection difference of a detection value identified as the first type is greater than the initial difference, the detection difference of a detection value identified as the second type is less than the initial difference. Conversely, when the detection difference of a detection value identified as the first type is less than the initial difference, the detection difference of a detection value identified as the second type is greater than the initial difference. For example, in some detecting periods, the reference value and at least one detection value change (increase or decrease) simultaneously, wherein the at least one detection value varies considerably more than the reference value, so the detection difference of said at least one detection value becomes larger or smaller. On the contrary, the detection differences of other detection values will change in the opposite manner.

One with ordinary skill in the art can recognize that the reference value and each detection value in the initial period may or may not be approximately equal. Similarly, one with ordinary skill in the art can recognize that the dimensions of the conductors electrically coupled to the first wire and each second wire may or may not be approximately equal. The present invention includes, but is not limited to, the dimensions of the conductors electrically coupled to the first wire and each second wire being equal or approximately equal.

In addition, the first and second types can be sued to represent two states, one representing a change of state, while the other representing no change of state. For example, the first type may represent a signal changed due to an external object touching or approaching a conductor, and the second type may represent a signal unchanged due to no external object touching or approaching a conductor. As another example, the first and second types can be applied to the use of switches. When the reference value exceeds a threshold, and at least one detection value varies considerably more than the reference value, the detection difference of an unchanged detection value will be greater than a threshold. This can be used to determine the unchanged detection value as one of open and close states, while other detection values as the other state.

Figure 7:
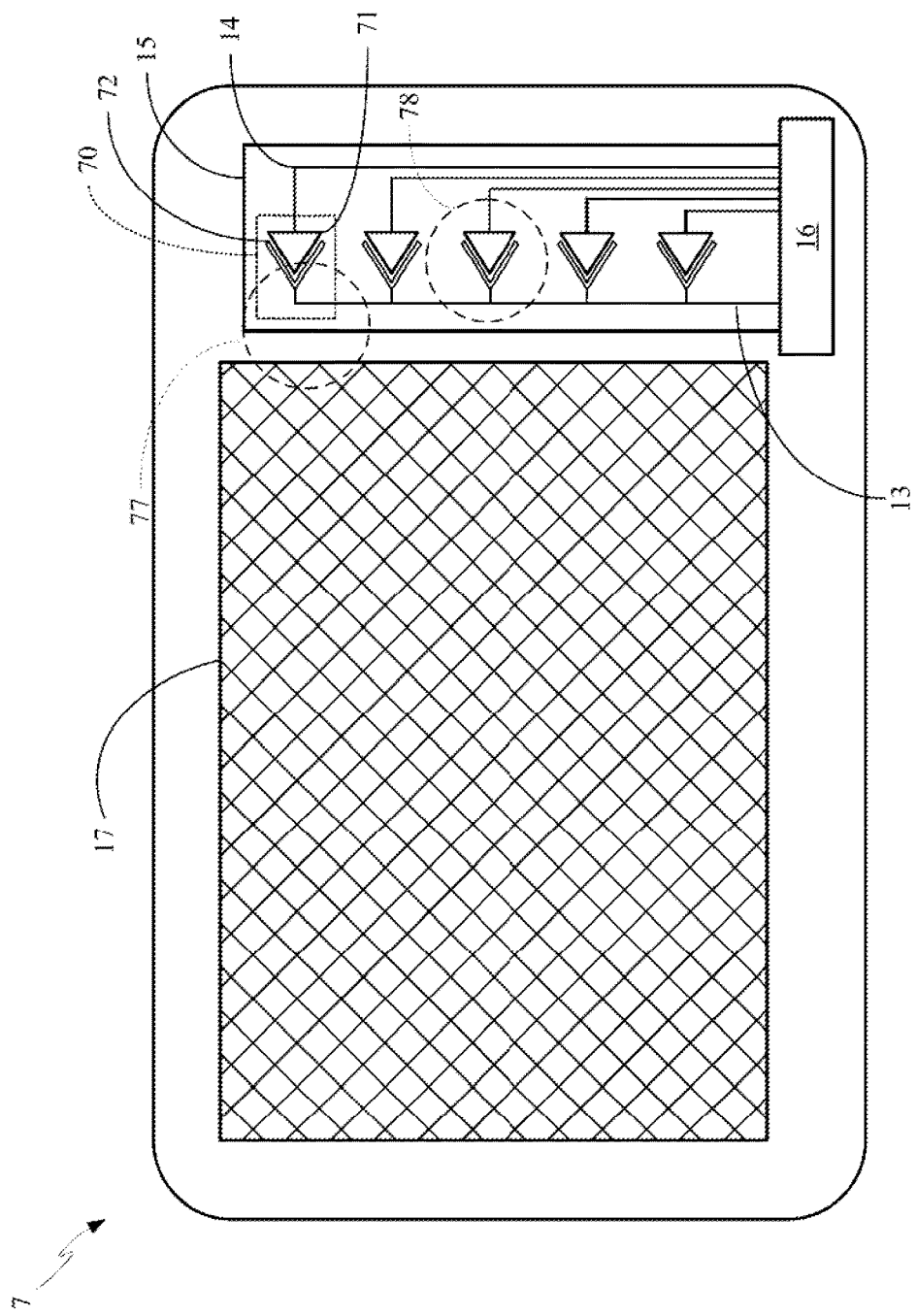
FIG. 7 is a schematic diagram depicting a capacitive sensor according to a fourth embodiment of the present invention.

Referring to FIG. 7, a capacitive sensor 7 is provided according to a fourth embodiment of the present invention. The capacitive sensor 7 includes a plurality of reference plates 72 and a plurality of detecting plates 71. In addition, this embodiment further includes a touch-sensitive sensor 17 adjacent to the capacitive sensor 7. Although five detectors 70 are shown in FIG. 7 as an example, one with ordinary skill in the art can appreciate that the number of the detectors includes, but is not limited to, five. When an external object touches or approaches the touch-sensitive sensor 17, it provides sensing information indicating the location of the external object in order to interpret the location of the external object. For example, the sensing information can be received by a controller 16, which determines the location of the external object. One with ordinary skill in the art can recognize that the touch-sensitive sensor 17 can be capacitive, resistive, surface acoustic, infrared, optical, and so on. The detection method of the sensing information is prior art, and will not be described any further.

In an example of the present invention, the area of a side of the detecting plate 71 facing towards the touch-sensitive sensor 17 is smaller than that of opposite side, wherein the area of the side facing the touch-sensitive sensor 17 and the area of the opposite side can be areas in a range with the same width between the two sides. For example, the detecting plate 71 is a triangle, with the summit pointing towards the touch-sensitive sensor 17, as shown in FIG. 7. Alternatively, one side facing the touch-sensitive sensor 17 is in an arc shape, such as a semicircle or a semi-ellipse.

The area of the side of the detecting plate 71 facing towards the touch-sensitive sensor 17 is determined based on the distance between the detecting plate 71 and the touch-sensitive sensor 17.

For example, as shown by a touching area 77 in FIG. 7, when an external object simultaneously touches or approaches the touch-sensitive sensor 17 and the detecting plate 71, the area of the detecting plate 71 touched or approached by the external object is considerably small, so the signal difference or the difference of the signal differences between the initial and the detecting periods will not exceed the predetermined range, thus it will not be regarded as an effective touch. On the contrary, as shown by a touching area 78 in FIG. 7, when the touch or approach by the external object falls mainly on the detecting plate 71, the signal difference or the difference of the signal differences between the initial and the detecting periods will be enough to exceed the predetermined range. Therefore, this can reduce misjudgment from occurring when the capacitive sensor 7 and touch-sensitive sensor 17 are close to each other.

In previous description, the dimensions of two entities being approximately equal means that the dimensions of the two are exactly equal or roughly equal, for example, the difference of the two is within 10%, e.g. one is bigger than the other by no more than 10%. The total dimension of at least one conductor to which the first wire 13 electrically coupled and the total dimension of at least one conductor to which each second wire 14 electrically coupled differs by no more than 10%.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A capacitive controller, executing:
   providing the same electrical signal to a first wire and each of at least one second wire directly connected to the capacitive controller, wherein all of at least one reference plate are electrically coupled to the first wire, and each of at least one detecting plate is electrically coupled to one of the at least one second wire; and
   comparing a first signal difference with a second signal difference between a signal of one of the at least one second wire and a signal of the first wire so as to determine if the detecting plate electrically coupled to the second wire corresponding to the second signal difference is touched or approached by an external object, wherein the first signal difference is a difference between the signal of the first wire and a signal of one of the at least one second wire not touched or approached by any external object.

2. The capacitive controller of claim 1, wherein the at least one reference plate defines a space in which the detecting plate resides, and the at least one reference plate defines an opening through which a corresponding second wire is electrically coupled to the detecting plate.

3. The capacitive controller of claim 2, wherein the space is defined by a single reference plate.

4. The capacitive controller of claim 1, wherein the second wire corresponding to the first signal difference is the same as the second wire corresponding to the second signal difference, and the first signal difference and the second signal difference are detected asynchronously.

5. The capacitive controller of claim 1, wherein further executing: determining the first signal difference if the first signal difference is within a predetermined range because no external object touches or approaches the detecting plate electrically coupled to the second wire corresponding to the first signal difference.

6. The capacitive controller of claim 1, wherein the detecting plate corresponding to the second signal difference is touched or approached by an external object if a difference between the first signal difference and the second signal difference is positive, and the detecting plate corresponding to the second signal difference is not touched or approached by any external object if a difference between the first signal difference and the second signal difference is negative.

7. The capacitive controller of claim 1, wherein a shielding line surrounds the first wire and each second wire.

8. The capacitive controller of claim 1, wherein the area of a side of each detecting plate facing towards a touch-sensitive sensor is smaller than that of opposite side, wherein the area of the side facing the touch-sensitive sensor and the area of the opposite side can be areas in a range with the same width between the two sides.

9. The capacitive controller of claim 1, wherein the dimension of each detecting plate is equal or approximately equal the total dimension of all of the reference plates.

10. The capacitive controller of claim 1, wherein the second wire corresponding to the first signal difference is different from the second wire corresponding to the second signal difference, and the first signal difference and the second signal difference are detected synchronously or asynchronously.

11. A capacitive sensor, comprising:
    a first wire;
    at least one second wire;
    at least one reference plate for defining at least one space, and all of the reference plates being electrically coupled to the first wire;
    at least one detecting plate, each of which residing in one of the at least one space and being electrically coupled to one of the at least one second wire; and
    a controller for providing the same electrical signal to the first wire and each second wire directly connected to the capacitive controller, and comparing a first signal difference with a second signal difference between a signal of one of the at least one second wire and a signal of the first wire so as to determine if the detecting plate electrically coupled to the second wire corresponding to the second signal difference is touched or approached by an external object, wherein the first signal difference is a difference between the signal of the first wire and a signal of one of the at least one second wire not touched or approached by any external object.

12. The capacitive sensor of claim 11, wherein the at least one reference plate defines a space in which the detecting plate resides, and the at least one reference plate defines an opening through which a corresponding second wire is electrically coupled to the detecting plate.

13. The capacitive sensor of claim 12, wherein the space is defined by a single reference plate.

14. The capacitive sensor of claim 11, wherein the second wire corresponding to the first signal difference is the same as the second wire corresponding to the second signal difference, and the first signal difference and the second signal difference are detected asynchronously.

15. The capacitive sensor of claim 11, wherein the controller determines the first signal difference if the first signal difference is within a predetermined range because no external object touches or approaches the detecting plate electrically coupled to the second wire corresponding to the first signal difference.

16. The capacitive sensor of claim 11, wherein the detecting plate corresponding to the second signal difference is touched or approached by an external object if a difference between the first signal difference and the second signal difference is positive, and the detecting plate corresponding to the second signal difference is not touched or approached by any external object if a difference between the first signal difference and the second signal difference is negative.

17. The capacitive sensor of claim 11, wherein a shielding line surrounds the first wire and each second wire.

18. The capacitive sensor of claim 11, wherein the area of a side of each detecting plate facing towards a touch-sensitive sensor is smaller than that of opposite side, wherein the area of the side facing the touch-sensitive sensor and the area of the opposite side can be areas in a range with the same width between the two sides.

19. The capacitive sensor of claim 11, wherein the dimension of each detecting plate is equal or approximately equal the total dimension of all of the reference plates.

20. The capacitive sensor of claim sensor 11, wherein the second wire corresponding to the first signal difference is different from the second wire corresponding to the second signal difference, and the first signal difference and the second signal difference are detected synchronously or asynchronously.

* * * * *